LOW POWER DRAIN SEMI-CONDUCTOR CIRCUIT

Filed Jan. 7. 1966

INVENTOR
Ciro A. Cancro

BY

ATTORNEYS

LOW POWER DRAIN SEMI-CONDUCTOR CIRCUIT

Filed Jan. 7, 1966

INVENTOR
Ciro A. Cancro

BY

ATTORNEYS 3,426,219

LOW POWER DRAIN SEMI-CONDUCTOR CIRCUIT

Ciro A. Cancro, Silver Spring, Md., assignor to the United States of America as represented by the Administrator of the National Aeronautics and Space Administration Filed Jan. 7, 1966, Ser. No. 519,395
U.S. Cl. 307—268 12 Claims
Int. Cl. H03k 5/00, 3/26

ABSTRACT OF THE DISCLOSURE

A solid state low power drain circuit which generates an output pulse with width independent of input pulse width. A transistor constant current source drives a tunnel diode, the output thereof being fed back to the input. By controlling the relative amplitudes of the input pulse and the feedback signal, the circuit may be made to act as a frequency limiter or gated oscillator. The circuit also provides a delayed output.

Figure 1:
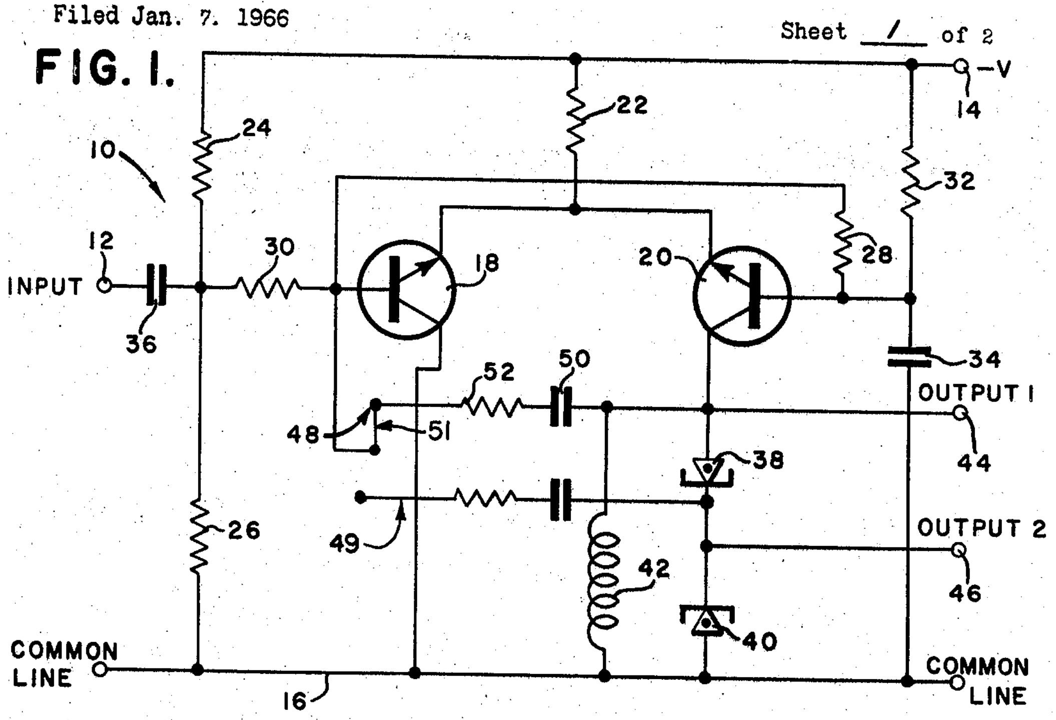

The invention described herein was made by an employee of the United States Government and may be manufactured by or for the Government for governmental purposes without the payment of any royalties thereon or therefor.

The present invention relates to a new and improved low power drain solid state circuit for generating pulses having widths in the nanosecond range, and, more particularly, to such a circuit used as a pulse regenerator (with output pulse width independent of input pulse width), as a frequency compressor and/or as a gated oscillator.

Conventional circuits of the type described normally differentiate the input pulses and then use the resulting spike to trigger a pulse generator for pulse regeneration. Moreover, conventional circuits used as frequency compressors and gated oscillators normally include a number of gates and timing circuits into which the differentiated signals are fed. It is apparent that this conventional circuitry is relatively complex and exhibits relatively large power drain, especially when operating with pulses at approximately 50–100 nanoseconds.

It is a primary object of the present invention to avoid the above problems in the art and to provide a low power drain solid state circuit which can efficiently and effectively operate in the nanosecond range and which produces output pulses the widths of which are independent of the input pulse width.

It is an object of the present invention to provide a low power drain solid state circut for efficiently operating in the nanosecond range and which behaves as a pulse regenerator in that an output pulse cycle is produced whenever an input pulse of sufficient energy is applied thereto.

It is another object of the present invention to provide a low power drain solid state circuit which behaves as a frequency compressor above a predetermined frequency in that the freqeuncy of the output signal varies in a fixed relationship to the frequency of the input signal, but never exceeds the predetermined frequency.

It is still another object of the present invention to provide a low power drain solid state circuit which produces a predetermined number of output pulses independent of the number of input pulses applied thereto.

In addition to the invention being capable of performing the above objects, it has the feature of acting as a low power drain solid state oscillator which may be gated on or off by the presence or absence, respectively, of a control voltage.

Essentially, the present invention is a monostable circuit comprising two transistors, one of which is normally conducting and the other of which is normally non-conducting; a negative resistance device, such as a pair of tunnel diodes formed in a back-to-back configuration, connected in parallel with an inductor in the collector circuit of the normally non-conductive transistor; and a feedback circuit connected from the collector of the normally non-conducting transistor to the base of the normally conducting transistor. With this configuration, the monostable circuit can perform in various modes of operation depending upon whether the pulse width and/or magnitude of an external signal applied to the base of the normally conducting transistor is greater or less than the pulse width and/or magnitude of the voltage coupled by the feedback circuit to the same base. Specially, the circuit can function as a pulse regenerator (with the width of the output pulse being independent of the width of the input pulse), as a frequency compressor or as a gated oscillator.

Figure 4:
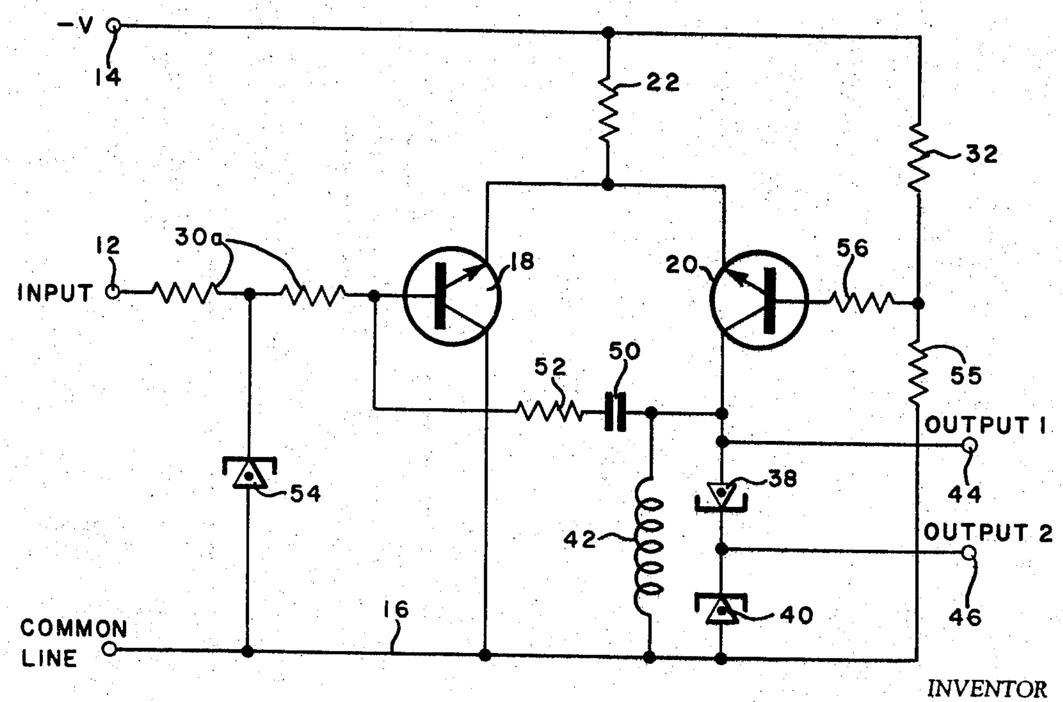
Figure 2A:
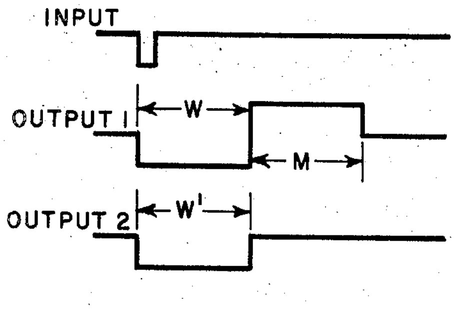
Figure 2B:
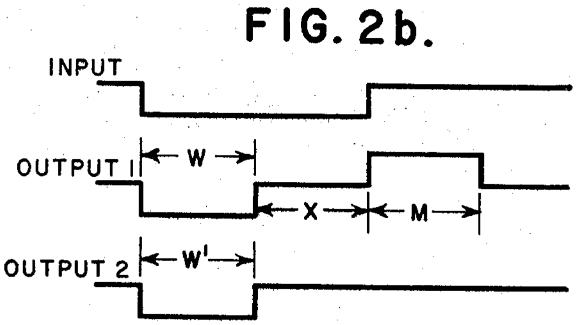
Figure 3A:
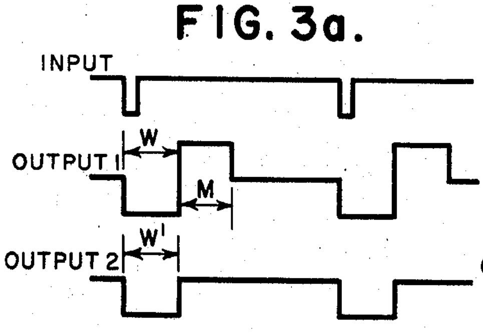
Figure 3B:
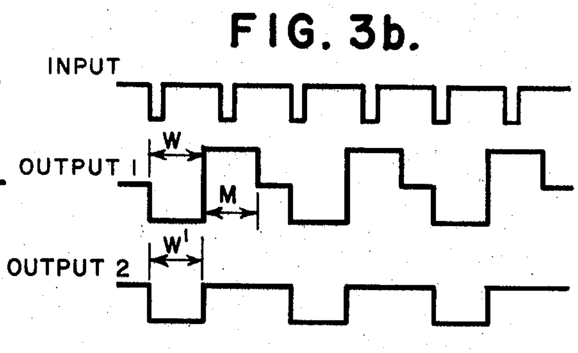
Figure 5:
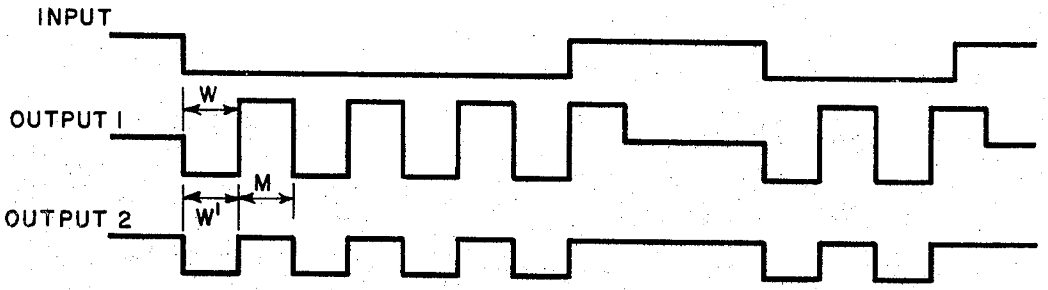

Other and further objects of the present invention will become apparent to those skilled in the art in view of the following detailed description taken together with the appended drawings in which:

FIGURE 1 is a schematic illustration of a preferred embodiment of the present invention;

FIGURES 2*a* and 2*b* show a single pulse cycle obtained from the circuit of FIGURE 1 in its operation as a pulse regenerator;

FIGURES 3*a* and 3*b* show the voltage wave forms obtained from the circuit of FIGURE 1 in its operation as a pulse regenerator and a frequency compressor, respectively;

FIGURE 4 is a schematic illustration of another circuit embodiment of the present invention, different from that of FIGURE 1, by the biasing arrangement thereof; and FIGURE 5 shows the voltage wave forms obtained from the circuit of FIGURE 4 in its operation as a gated oscillator.

Referring now to FIGURE 1, the circuit generally indicated as 10, according to the present invention, comprises an input terminal 12, a negative voltage source 14 and a common line 16. A pair of transistors 18 and 20, sharing a common emitter resistor 22, are connected as emitter followers between voltage source 14 and common line 16. Transistor 18 is normally biased on by the voltage divider resistors 24 and 26 connected in series between negative voltage source 14 and common line 16, with their junction connected to the base of transistor 18 via base resistor 30; and transistor 20 is normally biased off by the voltage developed across resistors 26, 30, 28 and 32, where resistor 28 is connected between the bases of transistors 18 and 20 and resistor 32 is connected between the base of transistor 20 and negative voltage 14. Capacitor 36, connected between input terminal 12 and resistor 30, functions to couple an input signal to transistor 18; and capacitor 34, connected between the base of transistor 20 and common line 16, functions as a by-pass capacitor.

The collector of transistor 18 is connected directly to common line 16; and the collector of transistor 20 is connected to common line 16 through a pair of tunnel diodes 38 and 40 in a back-to-back configuration. Two output terminals are provided—output terminal 44 being connected to the collector of transistor 20 and output terminal 46 being connected to the junction between tunnel diodes 38 and 40. Inductor 42 is connected in parallel with tunnel diodes 38 and 40 and its value primarily determines the output pulse widths of pulses derived from output terminals 44 and 46, as more fully described below. It might be well to mention that the value of common emitter resistor 22 is selected so that the current flow therethrough is 1.5 to 2.0 times the triggering current ($I_p$) of tunnel diodes 38 and 40, and that the width of the output pulses from terminals 44, 46 may be temperature stabilized by using a thermistor for resistor 22.

A feedback circuit 48 is connected between the collector of transistor 20 and the base or control electrode of transistor 18 and comprises, in this example, a capacitor 50 and series resistor 52. This feedback circuit is provided to assure that the width of the output pulses on terminals 44 and 46 are maintained constant, independent of the width of the input pulses to the base of transistor 18 from terminal 12. The magnitude of the feedback pulse on circuit 48 should, for proper circuit operation, be graded on the input pulse applied to the base of transistor 18, and this input pulse should itself be graded on the threshold value of transistor 18. In this manner, feedback circuit 48 allows circuit 10 to behave as a pulse regenerator, frequency compressor, or gated oscillator.

More particularly, when the magnitude of the negative input pulse, applied to the base of transistor 18 from input terminal 12, exceeds the magnitude of positive going signal from feedback circuit 48, so that the voltage on the base of transistor 18 is sufficiently negative to maintain transistor 18 non-conducting, circuit 10 performs as a pulse regenerator (note FIGURE 3*a* for the waveforms). On the other hand, should the magnitude of the negative input pulse, from input terminal 12, be less than that of the positive going feedback signal coupled to the base of transistor 18, so that transistor 18 starts conducting, then the circuit operates as a frequency compressor, or gated oscillator, depending upon the width of the input pulse at terminal 12 (note FIGURES 3*b* and 5 for the waveforms).

The table that follows is included to readily illustrate the conditions under which circuit 10 will perform as a pulse regenerator, frequency compressor or gated oscillator.

state and capacitor 34 has assumed a predetermined voltage. Now, when a negative input pulse is applied to input terminal 12, it triggers transistor 18 off and transistor 20 on, since the voltage at the base of transistor 20 is held constant by capacitor 34. Although a portion of the input pulse may be fed through feedback circuit 48 to tunnel diodes 38 and 40, these tunnel diodes will not be switched to a high voltage state because the current value supplied thereto by that portion of the input pulse is not great enough to cause a switching action. Feedback circuit 48 does function, however, to feedback, to the base of transistor 18, the output voltage appearing at terminal 44.

When transistor 20 initially starts to conduct, inductor 42 presents a high impedance, and all of the collector current of transistor 20 flows through tunnel diodes 38 and 40. Tunnel diode 38, having the current flowing therethrough in a direction opposite that yielding switching action, acts at low impedance, and for all practical purposes can be considered to be a short circuit. Now, as the collector current flowing exceeds $I_p$ (the triggering current of the tunnel diode), tunnel diode 40, being connected to be in a direction to yield switching action, is triggered to its high voltage state. Very rapidly, the current flowing through transistor 20 starts to be passed by inductor 42, thereby decreasing the current through tunnel diodes 38 and 40 until this current reduces to a value such that tunnel diode 40 switches to its low voltage state. By the parallel circuit of inductor 42 and tunnel diodes 38 and 40 performing in the manner just described, negative pulses are yielded at terminals 44 and 46, having width W and W′, respectively, as shown as OUTPUT 1 and OUTPUT 2 in FIGURES 2*a* and 2*b*. The widths of these pulses are primarily determined by the value of inductor 42.

It should be noted for circuit 10 to function, as thus

| Relationship of the pulse applied to the base of transistor 18 from terminal 12 to the width W of the negative portion of the pulse cycle obtained from terminal 44 and/or the duration of the entire cycle. | Circuit operation when the negative pulse applied to the base of transistor 18 from input terminal 12 is sufficiently greater in magnitude than the positive pulse from feedback circuit 48 so that transistor 18 is maintained in its non-conducting state. | Circuit operation when the positive feedback pulse from feedback circuit 48 to the base of transistor 18 is sufficiently greater than magnitude of negative pulse to base of transistor 18 from terminal 12 so that transistor 18 is put in its conducting state. |
|---|---|---|
| Pulse of duration less than pulse width W and pulse repetition period greater than duration of pulse cycle. | Pulse Regenerator | Pulse Regenerator. |
| Pulse of duration less than pulse width W and pulse repetition period less than duration of pulse cycle. | | Frequency Compressor. |
| Pulse of duration greater than pulse width W and pulse repetition period greater than duration of pulse cycle. | Pulse Regenerator | Pulse Regenerator if pulse duration is substantially that of a pulse cycle; and Gated Oscillator if pulse duration is much greater than a pulse cycle. |
| Pulse duration greater than pulse width W and pulse repetition period less than duration of pulse cycle. | | |

So that one will have a better understanding of the invention, it is pointed out that, when circuit 10 performs as a pulse regenerator (as described hereinafter), for every pulse applied to input terminal 12, containing sufficient energy to operate circuit 10, an output signal of one pulse cycle is obtained at output terminal 44 and an output signal of one pulse is obtained at terminal 46. One pulse cycle, as used herein, is considered to be the signal formed by the negative and positive pulse obtained at output terminal 44 by the application of single pulse to input terminal 12. As shown in FIGURE 2*a*, OUTPUT 1 shows a pulse cycle having a duration determined by the width W of the negative pulse and the width M of the positive pulse. This pulse cycle is shown as having a greater duration in FIGURE 2*b* where it not only includes the width W and the width M of the negative and positive pulses, respectively, but, in addition, includes the spacing X therebetween.

The general operation of circuit 10 as a pulse regenerator will now be presented. Initially, transistor 18 is in a conducting state, transistor 20 is in a nonconductive far described, transistors 20 and 18 must be conducting and non-conducting, respectively, for a period equal to the width W of the negative pulse at terminal 44 represented as OUTPUT 1. When the width of the input pulse to the base of transistor 18, from input terminal 12, is equal to or greater than the pulse width W as shown in FIGURE 2*b*, this condition is satisfied. However, in a situation where the pulse from terminal 12 has a width insufficient to maintain transistor 18 non-conducting for the proper period (note FIGURE 2*a*), then feedback circuit 48 comes into action, in that it feeds back to the base of transistor 18, a signal sufficient to keep the transistor non-conducting as required. Therefore, it can be readily observed that feedback circuit 48 assures the width W of the output pulse at terminal 44 is maintained constant, independent of the width of the input pulse applied to the base of transistor 18 from terminal 12.

So far the discussion of the operation of circuit 10 has been directed toward the production at output terminal 44, of the negative pulse portion of the pulse cycle. At such time as transistor 20 goes to its non-conducting or high impedance state, as for example, when there is no longer a signal on the base of transistor 18, from either input terminal 12 or from feedback circuit 48, sufficient to maintain it in its non-conducting state, current flows from inductor 42 through back-to-back tunnel diodes 38 and 40 to common line 16. Since tunnel diode 40 now has the current flowing therethrough in a direction opposite that yielding switching action it behaves as a low impedance. On the other hand, tunnel diode 38, having current flow therethrough in a direction that yields switching action, is capable of being triggered to a high voltage state. Tunnel diode 38 remains in this state until the current therethrough decays to where it is triggered to its low voltage state. At this time the pulse cycle at output terminal 44 is concluded.

The operation of inductor 42 and back-to-back tunnel diodes 38 and 40, as just described, results in a positive pulse of width M, as shown in FIGURES 2*a* and 2*b*, being at terminals 44 as OUTPUT 1. No output is produced at output terminal 46 at this time since, as already mentioned, tunnel diode 40 acts as a short and has essentially no voltage developed thereacross. The width M of this pulse is determined in a major part by the value of inductor 42. It is to be noted that the particular time at which the positive pulse is initiated is determined by when transistor 20 goes into its non-conducting state.

The pulse cycle of FIGURE 2*a* is obtained when the width of the input pulse from terminal 12 is smaller than width W of the negative output pulse from terminal 44. In this case, as the input pulse falls to zero, the output voltage at terminal 44 is fed back, via feedback circuit 48, to the base of transistor 18, holding it off and keeping transistor 20 conducting until such time as tunnel diode 40 switches to its low voltage state. Since the action of feedback circuit 48 results in the input pulse to the base of transistor 18 appearing to be at least as wide as pulse width W, the negative pulse of width W of the pulse cycle, labelled as OUTPUT 1 in the figure is produced at terminal 44. During the same period of time the negative pulse of width W' appears as OUTPUT 2 at terminal 46. OUTPUT 1 at terminal 44 immediately becomes a positive pulse of width M upon the termination of conduction of transistor 20, in the manner already described above. OUTPUT 2, at terminal 46, remains at zero voltage level after the termination of the pulse of width W' since there is no voltage drop across tunnel diode 40 at this time. The positive and negative pulses W and M, respectively, forming the pulse cycle of OUTPUT 1 have approximately the same width in as much as the width of both pulses are generally determined by the value of the inductor 42.

In FIGURE 2*b* there is shown OUTPUTS 1 and 2 for the case where the negative input pulse from terminal 12 has a pulse width greater than W and, in addition, the magnitude of this negative input pulse is selected so that as compared with the feedback voltage, it will be sufficiently negative to maintain transistor 18 non-conducting. Therefore, when the feedback pulse goes to zero level, the input signal, still being sufficiently negative, continues holding transistor 18 off and thus sustains current flow through inductor 42 and transistor 20. In this case, the feedback signal has no effect on the state of conduction of transistors 18 and 20; and it is not until the input signal at terminal 12 returns to zero voltage level that the positive pulse of width M of OUTPUT 1 is produced at terminal 44. Thus, a pulse cycle of a negative pulse and a positive pulse having fixed widths W and M, respectively, with a zero voltage level spacing X therebetween is obtained at output terminal 44; and a pulse of fixed width W' is obtained at terminal 46. It is to be noted that the widths of these various pulses are independent of the width of the input pulse from terminal 12. The width of the input pulse merely determines the spacing X between the negative and positive pulse of a pulse cycle.

In summary, it can be stated that circuit 10, as thus far described, will always perform as a pulse regenerator as long as the pulse repetition period of the input signal to the base of transistor 18 is greater than a pulse cycle and the magnitude of the input pulse is sufficiently negative as compared with the feedback voltage so that transistor 18 will be maintained non-conductive. Now, if the position of switch 51 is reversed, the end of the feedback circuit 48, connected to the base of transistor 20, is disconnected and instead feedback circuit 49 connected to the junction of tunnel diodes 38 and 40, is connected to the base of transistor 18. Then circuit 10 functions as a pulse regenerator regardless of the relative magnitudes of the input and feedback pulses. However, circuit 10, modified in this fashion, while not limited in operation by the relationship of the magnitudes of the input and feedback voltages, still has a limitation of functioning as intended only when the pulse repetition period of the input pulses is equal to or greater than the pulse cycle. Therefore, with circuit 10 so modified, while the comparative magnitudes of the two signals have no bearing on the operation of the circuit, the pulse repetition period of the input pulses does.

Before proceeding further and discussing FIGURES 3*a*, 3*b* and 5, it might be well to explain that while the pulses of OUTPUT 1 and OUTPUT 2, in these figures, are illustrated as having a width shorter than that of the same outputs of FIGURES 2*a* and 2*b*, this is not the actual case. In all the figures, the pulses designated as having a width W, M and W' are respectively the same width. It is merely for purposes of ease of illustration that they are shown different in width.

FIGURES 3*a*, 3*b* and 5 illustrate the wave forms obtained from the circuit 10 of FIGURE 1 when the magnitude of the positive feedback voltage exceeds the magnitude of the negative input voltage sufficiently to permit transistor 18 to start conducting immediately after the production of the pulse of width W. In this instance, the input pulse to terminal 12 initiates a signal at output terminal 44, first going in a negative direction, for a duration W, determined by inductor 42, and then in a positive direction, for a duration M, again determined by inductor 42. When circuit 10 operates in this mode it can function as a pulse regenerator, a frequency compressor or gated oscillator, depending on the repetition period and width of the input pulse; and input pulse limiting techniques, as will be described below, can be used to produce these conditions.

For narrow pulses, of the type shown in FIGURES 3*a* and 3*b*, at input terminal 12, and the magnitude of the positive feedback voltage sufficiently exceeding the magnitude of the negative input voltage, it is to be observed that circuit 10 performs as a pulse regenerator, when the repetition period is greater than a pulse cycle, and provides the outputs shown in FIGURE 3*a*, and as a frequency compressor when the repetition is less than a pulse cycle, to provide the outputs shown in FIGURE 3*b*. Therefore, with narrow input pulses, the pulse repetition period determines whether circuit 10 performs as a pulse regenerator or frequency compressor. Now, with the same realtionship existing between the magnitudes of the input and feedback voltages and the pulses at terminal 12 are chosen to be wide, as shown in FIGURE 5, circuit 10 performs as a gated oscillator.

In summary, FIGURE 3*a* illustrates the case where the input pulses are narrow and have a pulse repetition period greater than a pulse cycle. Then circuit 10 performs as a pulse regenerator, independent of the difference in magnitude between the input and feedback voltages, and an output signal is produced at terminal 44 in which each pulse cycle thereof is initiated by the leading edge of an input pulse and has a duration $W+M$.

FIGURE 3*b* shows the case where the input pulses are narrow and have a pulse repetition period less than that of a pulse cycle. Then circuit 10 performs as a frequency compressor in that only every other input (the odd pulses) initiates an output signal of pulse cycle $W+M$ and negative pulse of width W′ at terminals 44 and 46, respectively. The even pulses, in being applied to terminal 12, during the production of pulse cycle at terminal 44, has no effect in the operation of circuit 10 in that the circuit behaves as if they really don't exist. Accordingly, with circuit 10 performing in this manner to provide one output pulse cycle at terminal 44 for every two input pulses at terminal 12 the pulse repetition frequency of the pulse cycles is one half (½) that of the input pulses. Should there be more than two input pulses during a period of a pulse cycle, then each pulse cycle produced would be representative of the number of pulses being applied to input terminal 12 during its production. For example, if five input pulses resulted in a single pulse cycle being produced, the pulse repetition frequency at the output will be one fifth (⅕) that at the input.

FIGURE 5 shows the wave forms obtained from circuit 10 of FIGURE 1 when the input pulse width is greater than the duration of a pulse cycle. In this instance the circuit performs as a gated oscillator and generates pulse cycles, each of period of $W+M$, as long as the input pulse is present on input terminal 12.

Circuit 10 of FIGURE 1 has its input A.C. coupled through capacitor 36, which is satisfactory when the input pulse does not diminish, as a result of the RC time constant, (determined by capacitor 36 and the effective input resistance of circuit 10), below the threshold value of transistor 18 during its desired gating period. However, when the input signal is of high duty cycle, then the D-C coupling used in the circuit of FIGURE 4 is preferable. This circuit shows a modification of FIGURE 1 wherein input terminal 12 is direct coupled, via resistors 30*a*, to the base of transistor 18, and tunnel diode 54 (to provide limiting action) is connected between the junction of resistors 30*a* and common line 16. In addition, the biasing arrangement of FIGURE 1 is altered by deleting resistors 24, 26 and 28 and capacitor 34 and substituting therefor, resistors 55 and 56, as shown in FIGURE 4.

As mentioned above, the circuits of both FIGURES 1 and 4 can function as a pulse regenerator, frequency compressor or gated oscillator depending upon whether the magnitude of the feedback signal of feedback circuit 48 is greater than or less than the magnitude of the input signal to the base of transistor 18. To assist in grading these two signals so that the circuits will operate in an intended manner, tunnel diodes 38 and 40, in FIGURES 1 and 4, the tunnel diode 54, in FIGURE 4, can have their compositions varied (be of silicon, germanium, etc.) in accordance with the grading desired. For example, to assure that the circuit of FIGURE 4 will perform as a gated oscillator, tunnel diodes 38 and 48 are made of silicon and have an output voltage of approximately 0.7 volt, and tunnel diode 54 is made of germanium and limits the voltage applied to the base of transistor 18 to 0.4 volt.

Other modifications of the circuits of FIGURES 1 and 4 are available, thereby permitting all possible combinations of polarities of input and output voltages. For example, the polarity of the semiconductor components and voltage sources can be reversed with the result that the INPUT and OUTPUT voltages, as shown in FIGURES 2*a*, 2*b* and 5 are of opposite polarity. Also, while not shown, the circuitry of FIGURES 1 and 4 can be modified so that input can be applied to the normally nonconducting transistor instead of to the normally conducting transistor. This allows for the output voltages to have the same polarity as shown in FIGURES 2*a*, 2*b*, 3*a*, 3*b* and 5 with input voltage being of opposite polarity as shown in these figures.

It should be understood that the above disclosure is by way of example and that other and further modifications can be made thereto without departing from the spirit and scope of the present invention.

What is claimed is:

1. An electrical circuit for generating pulses comprising: a pair of interconnected switching means, said pair of switching means having respective input means; bias means connected to said pair of switching means such that when one of said pair of switching means is in a non-conductive state the other is in a conducting state; a pulse generating means comprising a pair of tunnel diodes connected in a back-to-back configuration and an inductor shunting said pair of tunnel diodes, said pulse generating means connected to one of said pair of switching means for generating a pulse of one polarity when the switching means to which it is connected starts conducting and generating a pulse of another polarity when the switching means to which it is connected stops conducting, said pulse generating means further including output means; and feedback means connected between the output means of said pulse generating means and the respective input means of the other of said pair of switching means to convey the pulses generated by the pulse generating means back to the other of said pair of switching means.

2. The electrical circuit of claim 1 wherein said feedback means comprises a capacitor in series with a resistor.

3. An electric circuit for generating pulses comprising: a voltage source; first and second semiconductor elements, each of said first and second semi-conductor elements having first, second and third electrodes, said first electrodes coupled to said voltage source; a biasing means; said second electrodes behaving as control electrodes and connected to said biasing means such that said first semiconductor element is in a conductive state and said second semi-conductor element is in a non-conductive state; an inductor; a common terminal; said third electrodes of said first and second semi-conductor elements coupled directly to said common terminal and through said inductor to said common terminal, respectively; a negative resistance device shunting said inductor; a feedback means connected between said negative resistance device and said second electrode of said first semi-conductor element; an input terminal coupled to said second electrode of said first semi-conductor element; and an output terminal connected to said negative resistance device.

4. The circuit as set forth in claim 3 wherein said biasing means maintains the magnitude of the voltage from said feedback means to said second electrode of said first semi-conductor element greater than the magnitude of the voltage thereto from said input terminal, whereby said circuit functions as a frequency compressor.

5. The circuit as set forth in claim 3 wherein said biasing means maintains the magnitude of the voltage from said feedback means to said second electrode of said first semi-conductor element less than the magnitude of the voltage thereto from said input terminal, whereby said circuit functions as a pulse regenerator.

6. The circuit as set forth in claim 3 wherein said feedback means comprises a capacitor in series with a resistor.

7. The circuit as set forth in claim 6 wherein said negative resistance device comprises a pair of back-to-back tunnel diodes having a common juntion and non-junction ends, and said output terminal and said common terminal are the non-junction ends of said pair of back-to-back tunnel diodes, and which further including another output terminal connected to the common junction between said back-to-back tunnel diodes.

8. The circuit as set forth in claim 7 wherein said feedback means is connected between said second electrode of said first semi-conductor element and said output terminal.

9. The circuit as set forth in claim 7 wherein said feedback means is connected between said second electrode of said first semi-conductor element and said other output terminal.

10. The circuit as set forth in claim 7 wherein said biasing means includes a pair of series resistors connected between said voltage source and said common terminal; a base resistor connected between the junction of said pair of series resistors and said second electrode of said first semi-conductor element; an emitter resistor connected between said first electrodes and said voltage source; and a coupling resistor connected between said second electrodes; and a resistor in series with a capacitor connected between said voltage source and said common terminal with the junction thereof connected to the second electrode of said second semi-conductor element.

11. The circuit as set forth in claim 10 further including an input capacitor connected to said junction of said pair of series resistors.

12. The circuit as set forth in claim 7 wherein said biasing means includes an emitter resistor connected between said first electrodes and said voltage source; a pair of series resistors connected between said second electrode of said first semi-conductor element and said input terminal; a tunnel diode connected between the junction of said series resistors and said common terminal; another pair of series resistors connected between said voltage source and said common terminal; and a resistor connected between the junction of said other series resistors and said second electrode of said second semi-conductor element.

References Cited

UNITED STATES PATENTS 2,709,747 5/1955 Gordon et al. ---- 328—203 XR

ARTHUR GAUSS, *Primary Examiner.*

JOHN ZAZWORSKY, *Assistant Examiner.*

U.S. Cl. X.R.

307—265, 274; 331—113